(12) United States Patent
Doll et al.

(10) Patent No.: US 8,537,539 B2
(45) Date of Patent: Sep. 17, 2013

(54) AIR CONDITIONING SYSTEMS FOR COMPUTER SYSTEMS AND ASSOCIATED METHODS

(75) Inventors: Wade J. Doll, Seattle, WA (US); Douglas P. Kelley, Seattle, WA (US)

(73) Assignee: Cray Inc., Seattle, WA (US)

(*) Notice: Subject to any disclaimer, the term of this patent is extended or adjusted under 35 U.S.C. 154(b) by 166 days.

(21) Appl. No.: 13/211,386

(22) Filed: Aug. 17, 2011

(65) Prior Publication Data
US 2012/0008275 A1    Jan. 12, 2012

Related U.S. Application Data

(63) Continuation of application No. 12/253,672, filed on Oct. 17, 2008, now Pat. No. 8,081,459.

(51) Int. Cl.
*H05K 7/20* (2006.01)

(52) U.S. Cl.
USPC ........ 361/679.5; 361/696; 361/698; 363/141; 62/259.2

(58) Field of Classification Search
USPC ........ 361/676–678, 679.46–679.54, 688–701
See application file for complete search history.

(56) References Cited

U.S. PATENT DOCUMENTS

| | | |
|---|---|---|
| 2,628,018 A | 2/1953 | Koch |
| 2,673,721 A | 3/1954 | Dickinson |
| 2,861,782 A | 11/1958 | Swartz |
| 3,120,166 A | 2/1964 | Lyman |
| 3,192,306 A | 6/1965 | Skonnord |
| 3,236,296 A | 2/1966 | Dubin |
| 3,317,798 A | 5/1967 | Chu et al. |
| 3,348,609 A | 10/1967 | Dubin et al. |
| 3,525,385 A | 8/1970 | Liebert |
| 3,559,728 A | 2/1971 | Lyman et al. |
| 3,648,754 A | 3/1972 | Sephton |
| 3,903,404 A | 9/1975 | Beall et al. |
| 3,942,426 A | 3/1976 | Binks et al. |
| 4,016,357 A | 4/1977 | Abrahamsen |
| 4,158,875 A | 6/1979 | Tajima et al. |
| 4,261,519 A | 4/1981 | Ester |
| 4,270,362 A | 6/1981 | Lancia et al. |
| 4,271,678 A | 6/1981 | Liebert |

(Continued)

FOREIGN PATENT DOCUMENTS

| | | |
|---|---|---|
| JP | 2197195 A | 8/1990 |
| JP | 07-030275 A | 1/1995 |

(Continued)

OTHER PUBLICATIONS

Baer, D.B., "Emerging Cooling Requirements & Systems in Telecommunications Spaces," Telecommunications Energy Conference 2001, Oct. 14-18, 2001, pp. 95-100.

(Continued)

*Primary Examiner* — Courtney Smith
(74) *Attorney, Agent, or Firm* — Perkins Coie LLP (57) ABSTRACT

Computer systems with air cooling systems and associated methods are disclosed herein. In several embodiments, a computer system can include a computer cabinet holding multiple computer modules, and an air mover positioned in the computer cabinet. The computer system can also include an airflow restrictor positioned proximate to an air outlet of the computer cabinet, and an overhead heat exchanger mated to the computer cabinet proximate to the air outlet.

10 Claims, 8 Drawing Sheets

(56) References Cited

U.S. PATENT DOCUMENTS

| | | | |
|---|---|---|---|
| 4,306,613 | A | 12/1981 | Christopher |
| 4,313,310 | A | 2/1982 | Kobayashi et al. |
| 4,315,300 | A | 2/1982 | Parmerlee et al. |
| 4,386,651 | A | 6/1983 | Reinhard |
| 4,449,579 | A | 5/1984 | Miyazaki et al. |
| 4,458,296 | A | 7/1984 | Bryant et al. |
| 4,473,382 | A | 9/1984 | Cheslock |
| 4,513,351 | A | 4/1985 | Davis et al. |
| 4,528,614 | A | 7/1985 | Shariff et al. |
| 4,535,386 | A | 8/1985 | Frey, Jr. et al. |
| 4,600,050 | A | 7/1986 | Noren |
| 4,642,715 | A | 2/1987 | Ende |
| 4,644,443 | A | 2/1987 | Swensen et al. |
| 4,691,274 | A | 9/1987 | Matouk et al. |
| 4,702,154 | A | 10/1987 | Dodson |
| 4,728,160 | A | 3/1988 | Mondor et al. |
| 4,767,262 | A | 8/1988 | Simon |
| 4,774,631 | A | 9/1988 | Okuyama et al. |
| 4,797,783 | A | 1/1989 | Kohmoto et al. |
| 4,798,238 | A | 1/1989 | Ghiraldi |
| 4,802,060 | A | 1/1989 | Immel |
| 4,860,163 | A | 8/1989 | Sarath |
| 4,874,127 | A | 10/1989 | Collier |
| 4,901,200 | A | 2/1990 | Mazura |
| 4,911,231 | A | 3/1990 | Horne et al. |
| 4,993,482 | A | 2/1991 | Dolbear et al. |
| 5,000,079 | A | 3/1991 | Mardis |
| 5,019,880 | A | 5/1991 | Higgins, III. |
| 5,035,628 | A | 7/1991 | Casciotti et al. |
| 5,060,716 | A | 10/1991 | Heine |
| 5,090,476 | A | 2/1992 | Immel |
| 5,101,320 | A | 3/1992 | Bhargava et al. |
| 5,131,233 | A | 7/1992 | Cray et al. |
| 5,150,277 | A | 9/1992 | Bainbridge et al. |
| 5,161,087 | A | 11/1992 | Frankeny et al. |
| 5,165,466 | A | 11/1992 | Arbabian |
| 5,168,925 | A | 12/1992 | Suzumura et al. |
| 5,196,989 | A | 3/1993 | Zsolnay |
| 5,263,538 | A | 11/1993 | Amidieu et al. |
| 5,273,438 | A | 12/1993 | Bradley et al. |
| 5,297,990 | A | 3/1994 | Renz et al. |
| 5,323,847 | A | 6/1994 | Koizumi et al. |
| 5,326,317 | A | 7/1994 | Ishizu et al. |
| 5,329,425 | A | 7/1994 | Leyssens et al. |
| 5,339,214 | A | 8/1994 | Nelson |
| 5,345,779 | A | 9/1994 | Feeney |
| 5,365,402 | A | 11/1994 | Hatada et al. |
| 5,376,008 | A | 12/1994 | Rodriguez |
| 5,395,251 | A | 3/1995 | Rodriguez et al. |
| 5,402,313 | A | 3/1995 | Casperson et al. |
| 5,410,448 | A | 4/1995 | Barker, III et al. |
| 5,414,591 | A | 5/1995 | Kimura et al. |
| 5,467,250 | A | 11/1995 | Howard et al. |
| 5,467,609 | A | 11/1995 | Feeney |
| 5,471,850 | A | 12/1995 | Cowans |
| 5,491,310 | A | 2/1996 | Jen |
| 5,493,474 | A | 2/1996 | Schkrohowsky et al. |
| 5,547,272 | A | 8/1996 | Paterson et al. |
| 5,570,740 | A | 11/1996 | Flores et al. |
| 5,572,403 | A | 11/1996 | Mills |
| 5,603,375 | A | 2/1997 | Salt |
| 5,603,376 | A | 2/1997 | Hendrix |
| 5,684,671 | A | 11/1997 | Hobbs et al. |
| 5,685,363 | A | 11/1997 | Orihira et al. |
| 5,707,205 | A | 1/1998 | Otsuka et al. |
| 5,709,100 | A | 1/1998 | Baer et al. |
| 5,718,628 | A | 2/1998 | Nakazato et al. |
| 5,749,702 | A | 5/1998 | Datta et al. |
| 5,782,546 | A | 7/1998 | Iwatare |
| 5,793,610 | A | 8/1998 | Schmitt et al. |
| 5,829,676 | A | 11/1998 | Ban et al. |
| 5,849,076 | A | 12/1998 | Gaylord et al. |
| 5,880,931 | A | 3/1999 | Tilton et al. |
| 5,927,386 | A | 7/1999 | Lin |
| 5,979,541 | A | 11/1999 | Saito et al. |
| 6,021,047 | A | 2/2000 | Lopez et al. |
| 6,024,165 | A * | 2/2000 | Melane et al. ............ 165/104.33 |
| 6,026,565 | A | 2/2000 | Giannatto et al. |
| 6,034,870 | A | 3/2000 | Osborn et al. |
| 6,039,414 | A | 3/2000 | Melane et al. |
| 6,046,908 | A | 4/2000 | Feng |
| 6,052,278 | A | 4/2000 | Tanzer et al. |
| 6,104,608 | A | 8/2000 | Casinelli et al. |
| 6,115,242 | A | 9/2000 | Lambrecht |
| 6,132,171 | A | 10/2000 | Fujinaka et al. |
| 6,135,875 | A | 10/2000 | French |
| 6,158,502 | A | 12/2000 | Thomas |
| 6,164,369 | A | 12/2000 | Stoller |
| 6,167,948 | B1 | 1/2001 | Thomas |
| 6,182,787 | B1 | 2/2001 | Kraft et al. |
| 6,183,196 | B1 | 2/2001 | Fujinaka |
| 6,185,098 | B1 | 2/2001 | Benavides |
| 6,205,796 | B1 | 3/2001 | Chu et al. |
| 6,208,510 | B1 | 3/2001 | Trudeau et al. |
| 6,236,564 | B1 | 5/2001 | Fan |
| 6,272,012 | B1 | 8/2001 | Medin et al. |
| 6,305,180 | B1 | 10/2001 | Miller et al. |
| 6,310,773 | B1 | 10/2001 | Yusuf et al. |
| 6,328,100 | B1 | 12/2001 | Haussmann |
| 6,332,946 | B1 | 12/2001 | Emmett et al. |
| 6,351,381 | B1 | 2/2002 | Bilski et al. |
| 6,359,779 | B1 | 3/2002 | Frank, Jr. et al. |
| 6,361,892 | B1 | 3/2002 | Ruhl et al. |
| 6,396,684 | B2 | 5/2002 | Lee |
| 6,416,330 | B1 | 7/2002 | Yatskov et al. |
| 6,421,240 | B1 * | 7/2002 | Patel ............................ 361/699 |
| 6,435,266 | B1 | 8/2002 | Wu |
| 6,439,340 | B1 | 8/2002 | Shirvan |
| 6,462,944 | B1 | 10/2002 | Lin |
| 6,481,527 | B1 * | 11/2002 | French et al. ................. 181/201 |
| 6,501,652 | B2 | 12/2002 | Katsui |
| 6,515,862 | B1 | 2/2003 | Wong et al. |
| 6,519,955 | B2 | 2/2003 | Marsala |
| 6,524,064 | B2 | 2/2003 | Chou et al. |
| 6,536,510 | B2 | 3/2003 | Khrustalev et al. |
| 6,542,362 | B2 | 4/2003 | Lajara et al. |
| 6,546,998 | B2 | 4/2003 | Oh et al. |
| 6,550,530 | B1 | 4/2003 | Bilski |
| 6,554,697 | B1 | 4/2003 | Koplin |
| 6,557,357 | B2 | 5/2003 | Spinazzola et al. |
| 6,557,624 | B1 | 5/2003 | Stahl et al. |
| 6,564,571 | B2 | 5/2003 | Feeney |
| 6,564,858 | B1 | 5/2003 | Stahl et al. |
| 6,582,192 | B2 | 6/2003 | Tseng |
| 6,587,340 | B2 | 7/2003 | Grouell et al. |
| 6,609,592 | B2 | 8/2003 | Wilson |
| 6,621,698 | B2 | 9/2003 | Chang |
| 6,628,520 | B2 | 9/2003 | Patel et al. |
| 6,631,078 | B2 | 10/2003 | Alcoe et al. |
| 6,644,384 | B2 | 11/2003 | Stahl |
| 6,646,879 | B2 | 11/2003 | Pautsch |
| 6,661,660 | B2 | 12/2003 | Prasher et al. |
| 6,679,081 | B2 | 1/2004 | Marsala |
| 6,684,457 | B2 | 2/2004 | Holt |
| 6,690,576 | B2 | 2/2004 | Clements et al. |
| 6,695,041 | B2 | 2/2004 | Lai et al. |
| 6,705,625 | B2 | 3/2004 | Holt et al. |
| 6,714,412 | B1 | 3/2004 | Chu et al. |
| 6,724,617 | B2 | 4/2004 | Amaike et al. |
| 6,725,912 | B1 | 4/2004 | Moll et al. |
| 6,742,068 | B2 | 5/2004 | Gallagher et al. |
| 6,742,583 | B2 | 6/2004 | Tikka |
| 6,745,579 | B2 | 6/2004 | Spinazzola et al. |
| 6,755,280 | B2 | 6/2004 | Porte et al. |
| 6,761,212 | B2 | 7/2004 | DiPaolo |
| 6,772,604 | B2 | 8/2004 | Bash et al. |
| 6,775,137 | B2 | 8/2004 | Chu et al. |
| 6,776,707 | B2 | 8/2004 | Koplin |
| 6,789,613 | B1 | 9/2004 | Ozaki et al. |
| 6,796,372 | B2 | 9/2004 | Bear |

| | | |
|---|---|---|
| 6,801,428 B2 | 10/2004 | Smith et al. |
| 6,819,563 B1 | 11/2004 | Chu et al. |
| 6,836,407 B2 | 12/2004 | Faneuf et al. |
| 6,854,287 B2 | 2/2005 | Patel et al. |
| 6,854,659 B2 | 2/2005 | Stahl et al. |
| 6,860,713 B2 | 3/2005 | Hoover |
| 6,867,966 B2 | 3/2005 | Smith et al. |
| 6,875,101 B1 | 4/2005 | Chien |
| 6,876,549 B2 | 4/2005 | Beitelmal et al. |
| 6,881,898 B2 | 4/2005 | Baker et al. |
| 6,882,531 B2 | 4/2005 | Modica |
| 6,896,095 B2 | 5/2005 | Shah et al. |
| 6,904,968 B2 | 6/2005 | Beitelmal et al. |
| 6,909,611 B2 | 6/2005 | Smith et al. |
| 6,914,780 B1 | 7/2005 | Shanker et al. |
| 6,932,443 B1 | 8/2005 | Kaplan et al. |
| 6,952,667 B2 | 10/2005 | Kempe |
| 6,975,510 B1 | 12/2005 | Robbins et al. |
| 6,992,889 B1 | 1/2006 | Kashiwagi et al. |
| 6,997,245 B2 | 2/2006 | Lindemuth et al. |
| 6,997,741 B2 | 2/2006 | Doll et al. |
| 6,999,316 B2 | 2/2006 | Hamman |
| 7,016,191 B2 | 3/2006 | Miyamoto et al. |
| 7,046,513 B2 | 5/2006 | Nishiyama et al. |
| 7,051,802 B2 | 5/2006 | Baer |
| 7,051,946 B2 | 5/2006 | Bash et al. |
| 7,059,899 B2 | 6/2006 | Doll et al. |
| 7,114,555 B2 | 10/2006 | Patel et al. |
| 7,120,017 B2 | 10/2006 | Shieh |
| 7,120,027 B2 | 10/2006 | Yatskov et al. |
| 7,123,477 B2 | 10/2006 | Coglitore et al. |
| 7,133,285 B2 | 11/2006 | Nishimura |
| 7,144,320 B2 | 12/2006 | Turek et al. |
| 7,152,418 B2 | 12/2006 | Alappat et al. |
| 7,154,748 B2 * | 12/2006 | Yamada ..................... 361/690 |
| 7,177,156 B2 | 2/2007 | Yatskov et al. |
| 7,182,208 B2 | 2/2007 | Tachibana |
| 7,185,696 B2 | 3/2007 | Schaper |
| 7,187,549 B2 | 3/2007 | Teneketges et al. |
| 7,193,846 B1 | 3/2007 | Davis et al. |
| 7,193,851 B2 | 3/2007 | Yatskov |
| 7,209,351 B2 | 4/2007 | Wei |
| 7,215,552 B2 | 5/2007 | Shipley et al. |
| 7,218,516 B2 | 5/2007 | Yu et al. |
| 7,222,660 B2 | 5/2007 | Giacoma et al. |
| 7,226,353 B2 | 6/2007 | Bettridge et al. |
| 7,227,751 B2 | 6/2007 | Robbins et al. |
| 7,242,579 B2 | 7/2007 | Fernandez et al. |
| 7,255,640 B2 | 8/2007 | Aldag et al. |
| 7,259,963 B2 | 8/2007 | Germagian et al. |
| 7,286,351 B2 | 10/2007 | Campbell et al. |
| 7,304,842 B2 | 12/2007 | Yatskov |
| 7,312,985 B2 | 12/2007 | Lee et al. |
| 7,314,113 B2 | 1/2008 | Doll |
| 7,315,448 B1 | 1/2008 | Bash et al. |
| 7,330,350 B2 | 2/2008 | Hellriegel et al. |
| 7,362,571 B2 | 4/2008 | Kelley et al. |
| 7,365,976 B2 | 4/2008 | Fujiya et al. |
| 7,367,384 B2 | 5/2008 | Madara et al. |
| 7,382,613 B2 | 6/2008 | Vinson et al. |
| 7,385,810 B2 | 6/2008 | Chu et al. |
| 7,397,661 B2 | 7/2008 | Campbell et al. |
| 7,411,785 B2 | 8/2008 | Doll |
| 7,418,825 B1 | 9/2008 | Bean, Jr. |
| 7,420,805 B2 | 9/2008 | Smith et al. |
| 7,430,118 B1 | 9/2008 | Noteboom et al. |
| 7,508,663 B2 | 3/2009 | Coglitore |
| 7,513,923 B1 | 4/2009 | Lewis et al. |
| 7,534,167 B2 | 5/2009 | Day |
| 7,542,287 B2 | 6/2009 | Lewis, II et al. |
| 7,554,803 B2 | 6/2009 | Artman et al. |
| 7,630,198 B2 | 12/2009 | Doll |
| 7,641,101 B2 | 1/2010 | Campbell et al. |
| 7,657,347 B2 | 2/2010 | Campbell et al. |
| 7,679,909 B2 | 3/2010 | Spearing et al. |
| 7,707,880 B2 | 5/2010 | Campbell et al. |
| 7,710,720 B2 | 5/2010 | Fuke et al. |
| 7,788,940 B2 | 9/2010 | Madara et al. |
| 7,830,658 B2 | 11/2010 | Van Andel |
| 7,895,854 B2 | 3/2011 | Bash et al. |
| 7,898,799 B2 | 3/2011 | Doll |
| 7,903,403 B2 | 3/2011 | Doll et al. |
| 8,081,459 B2 | 12/2011 | Doll et al. |
| 8,156,970 B2 | 4/2012 | Farese et al. |
| 8,170,724 B2 | 5/2012 | Kelley et al. |
| 8,261,565 B2 | 9/2012 | Borror et al. |
| 2002/0072809 A1 | 6/2002 | Zuraw |
| 2003/0053928 A1 | 3/2003 | Takano |
| 2004/0008491 A1 | 1/2004 | Chen |
| 2004/0020225 A1 | 2/2004 | Patel et al. |
| 2004/0052052 A1 | 3/2004 | Rivera |
| 2004/0221604 A1 * | 11/2004 | Ota et al. ............... 62/259.2 |
| 2005/0161205 A1 | 7/2005 | Ashe et al. |
| 2005/0186070 A1 | 8/2005 | Zeng et al. |
| 2005/0207116 A1 | 9/2005 | Yatskov et al. |
| 2005/0217837 A1 | 10/2005 | Kudija |
| 2005/0241810 A1 | 11/2005 | Malone et al. |
| 2006/0044758 A1 | 3/2006 | Spangberg |
| 2006/0180301 A1 | 8/2006 | Baer |
| 2007/0224084 A1 | 9/2007 | Holmes et al. |
| 2008/0078202 A1 | 4/2008 | Luo |
| 2008/0098763 A1 | 5/2008 | Yamaoka |
| 2008/0112128 A1 | 5/2008 | Holland |
| 2008/0158814 A1 | 7/2008 | Hattori |
| 2008/0212282 A1 | 9/2008 | Hall et al. |
| 2008/0216493 A1 | 9/2008 | Lin et al. |
| 2009/0154091 A1 | 6/2009 | Yatskov |
| 2009/0260384 A1 | 10/2009 | Champion et al. |
| 2010/0317279 A1 | 12/2010 | Yatskov |
| 2011/0112694 A1 | 5/2011 | Bash et al. |
| 2011/0255237 A1 * | 10/2011 | Doll ..................... 361/679.46 |
| 2012/0026691 A1 * | 2/2012 | Campbell et al. ............. 361/700 |
| 2012/0188706 A1 | 7/2012 | Kelley et al. |

FOREIGN PATENT DOCUMENTS

| | | |
|---|---|---|
| JP | 2002026548 A | 1/2002 |
| JP | 2002237692 A | 8/2002 |
| JP | 2004079754 | 3/2004 |
| WO | WO-01-86217 | 11/2001 |
| WO | WO-2005/027609 | 3/2005 |

OTHER PUBLICATIONS

Bleier, F. P., "FAN Handbook, Selection, Application, and Design," McGraw Hill, 1998, pp. 7.50-7.51.

"Frequently Asked Questions about Heat Pipes," Thermacore International, Inc., http://www.thermacore.com/hpt_faqs.htm, 3 pages [accessed Jun. 14, 2004].

Hannemann, R. et al., "Pumped Liquid Multiphase Cooling," ASME, 2004, IMECE 2004, Paper IMECE2004-60669, Anaheim, CA, 5 pages.

JAMSTEC/Earth Simulator Center, "Processor Node (PN) Cabinet," http://www.es.jamstec.go.jp/esc/eng/Hardware/pnc.html, 1 page, [accessed Mar. 5, 2004].

"Managing Extreme Heat Cooling Strategies for High-Density Computer Systems," Liebert Corporation, Dec. 7, 2003, Columbus, OH, 16 pages.

Marsala, J., "Pumped Liquid/Two Phase Cooling for High Performance Systems," Thermal Form & Function LLC, May 13, 2003, Scottsdale, AZ, 19 pages.

Novel Concepts, Inc., "Heat Spreaders," http://www.novelconceptsinc.com/heat-spreaders.htm, 2 pages [accessed Jun. 14, 2004].

Pitasi, M. "Thermal Management System Using Pumped Liquid R-134a with Two Phase Heat Transfer," Thermal Form & Function LLC, Manchester, MA, Mar. 2002, pp. 1-9, http:/www.coolingzone.com/Guest/News/NL_MAR_2002/TFF/Tff.html.

"Therma-base-Heat Sink," Thermacore Thermal Management Solutions, pp. 1-3, [accessed Jun. 14, 2005].

Thermal Form & Function LLC, "Box/Blade Cooling System," http://www.thermalformandfunction.com/boxsystem.html, Manchester, MA, 2005, 1 page [accessed May 10, 2006].

"Thermal Form & Function—Rack Cooling System (RCS)," Thermal Form & Function LLC, 2005, Manchester, MA, 1 page, http:/ www.thermalformandfunction.com/racksystem.html, [accessed May 11, 2006].

Vogel, M. et al., "Low Profile Heat Sink Cooling Technologies for Next Generation CPU Thermal Designs," *Electronic Cooling Online*, Feb. 17, 2005, 11 pages.

Webb, W., "Take the heat: Cool that hot embedded design," *EDN*, May 13, 2004, 5 pages.

\* cited by examiner

AIR CONDITIONING SYSTEMS FOR COMPUTER SYSTEMS AND ASSOCIATED METHODS

CROSS-REFERENCE TO RELATED APPLICATIONS

This application is a continuation of U.S. patent application Ser. No. 12/253,672, filed Oct. 17, 2008, now U.S. Pat. No. 8,081,459 which application is incorporated herein in its entirety by reference.

TECHNICAL FIELD

The following disclosure relates generally to air conditioning systems and associated methods for cooling computer systems.

BACKGROUND

Figure 1:
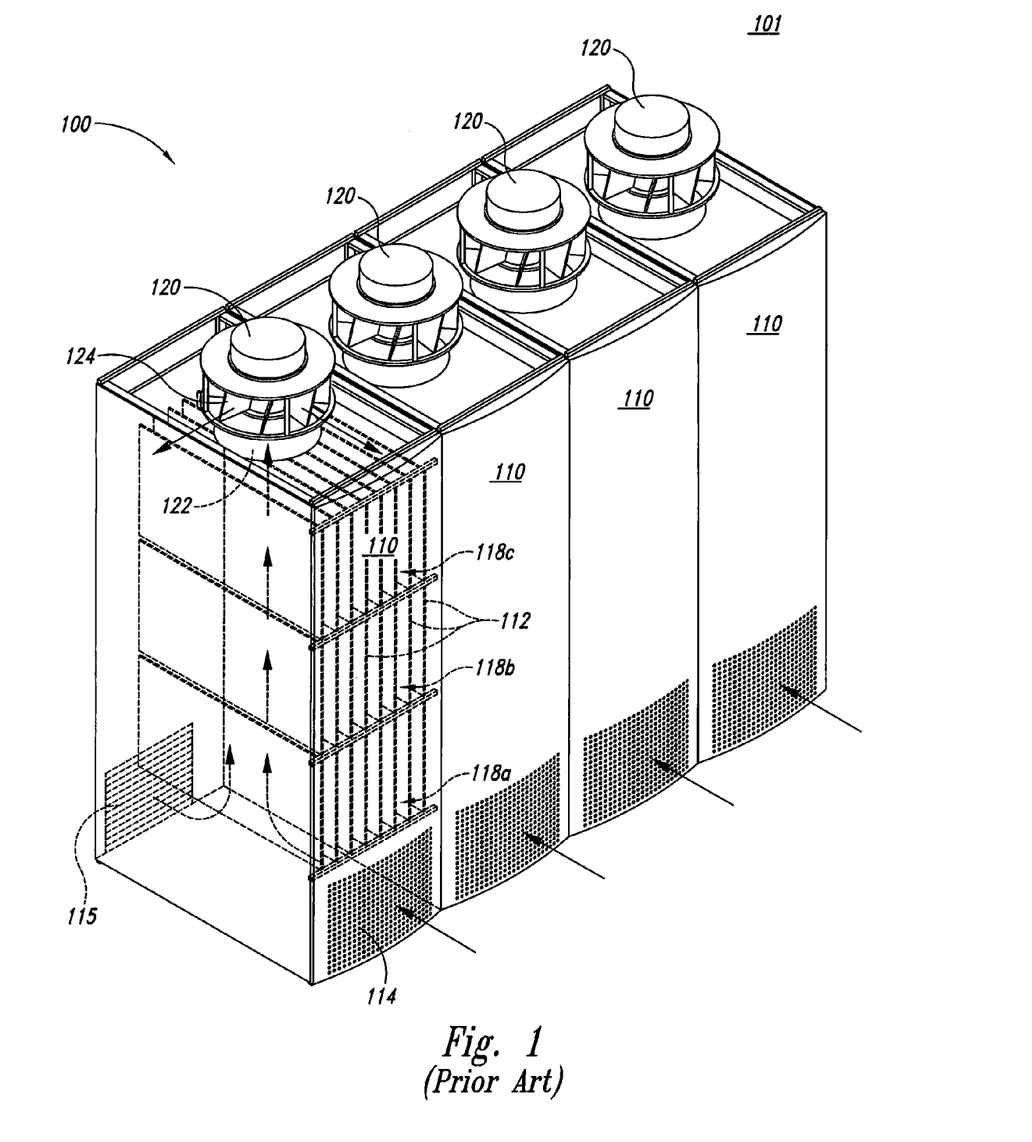
FIG. 1 is an isometric view of a bank of computer cabinets having top-mounted cooling fans in accordance with the prior art.

Supercomputers and other large computer systems typically include a large number of computer cabinets arranged in close proximity to one another. FIG. 1, for example, illustrates a portion of a conventional supercomputer system 100 in a room 101. The supercomputer system 100 includes a plurality of computer cabinets 110 arranged in a bank. Each of the computer cabinets 110 includes a plurality of module compartments 118 (identified individually as a first module compartment 118a, a second module compartment 118b, and a third module compartment 118c). Each module compartment 118 holds a plurality of computer modules 112 in close proximity to one another. Each of the computer modules 112 can include a motherboard electrically connecting a plurality of processors, memory modules, routers, and other microelectronic devices for data and/or power transmission.

Many of the electronic devices typically found in supercomputers, such as processors, generate considerable heat during operation. This heat can damage the electronic devices and/or degrade the performance of supercomputers if not dissipated. Consequently, supercomputers typically include both active and passive cooling systems to maintain device temperatures at acceptable levels.

To dissipate heat generated by the computer modules 112, the supercomputer system 100 further includes a plurality of fans 120 mounted to upper portions of corresponding computer cabinets 110. In operation, each of the fans 120 draws cooling air into the corresponding computer cabinet 110 through a front inlet 114 and/or a back inlet 115 positioned toward a bottom portion of the computer cabinet 110. The cooling air flows upward through the computer cabinet 110, past the computer modules 112, and into a central inlet 122 of the fans 120. The fans 120 then exhaust the cooling air outward in a radial pattern through a circumferential outlet 124.

As the power consumption of the electronic devices increases, the computer modules 112 in the module compartments 118 heat the incoming cooling air to higher temperatures. Conventional techniques for dealing with the higher temperatures of the cooling air entering subsequent module compartments 118 include increasing the air flow rate through the individual computer cabinets 110. The higher air flow rate, however, increases the pressure drop over the computer modules 112, and the fans 120 may be unable to compensate for the increased pressure drop. As a result, the cooling air flowing past the computer modules 112 may be insufficient to prevent overheating, which may adversely affect the performance of the computer system 100.

DETAILED DESCRIPTION

The following disclosure describes several embodiments of air-cooled systems and associated methods for cooling computer systems. Other embodiments of the invention can have different configurations, components, or procedures than those described below. A person of ordinary skill in the art, therefore, will accordingly understand that the invention can have other embodiments with additional elements, or the invention can have other embodiments without several of the features shown and described below with reference to FIGS. 2-8.

In the Figures, identical reference numbers identify identical or at least generally similar elements. To facilitate the discussion of any particular element, the most significant digit or digits of any reference number refer to the Figure in which that element is first introduced. Element 202, for example, is first introduced and discussed with reference to FIG. 2.

Figure 2A:
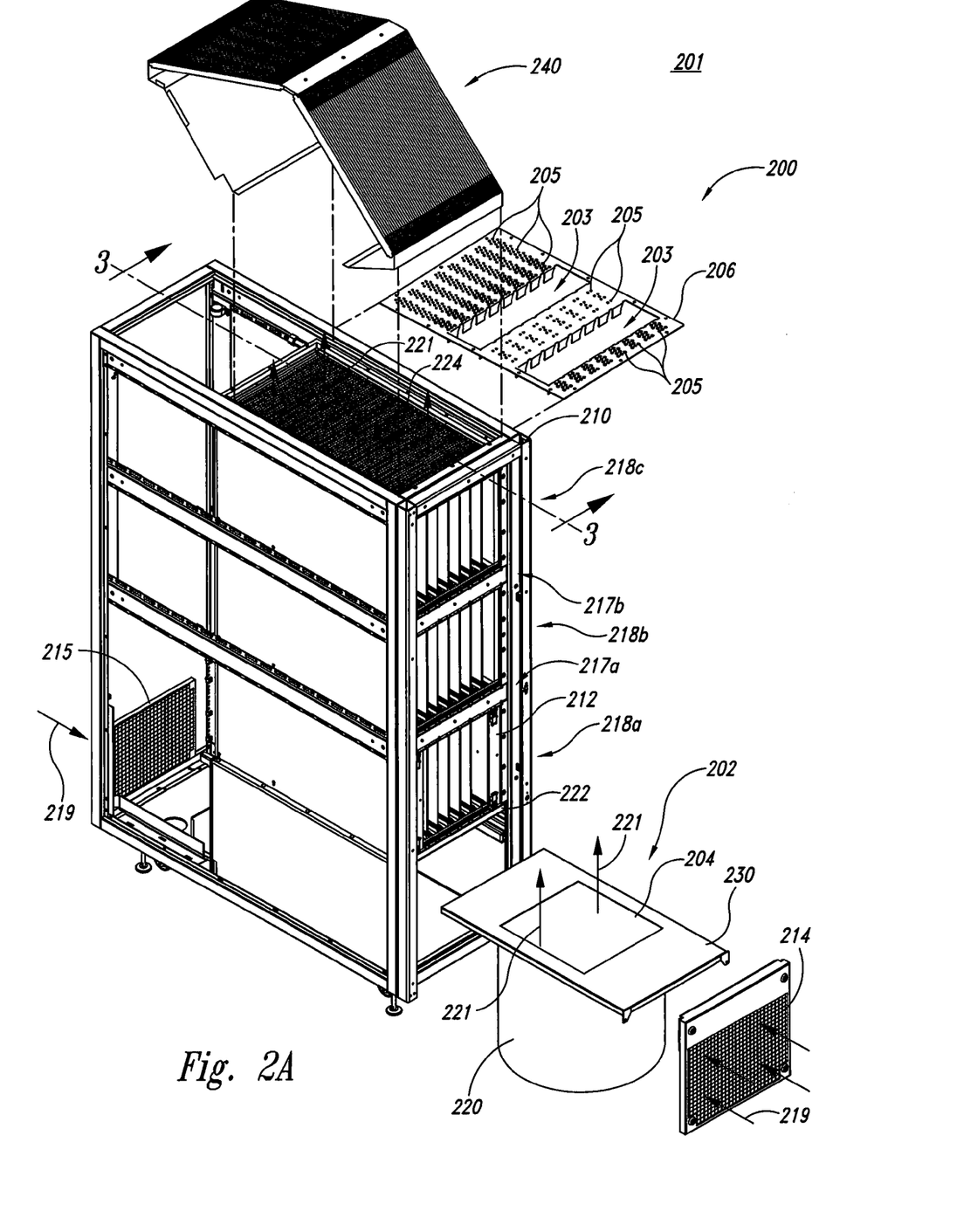
FIG. 2A is a partially exploded isometric view of a computer system having a computer cabinet carrying an airflow restrictor and an overhead heat exchanger configured in accordance with an embodiment of the invention.
Figure 2B:
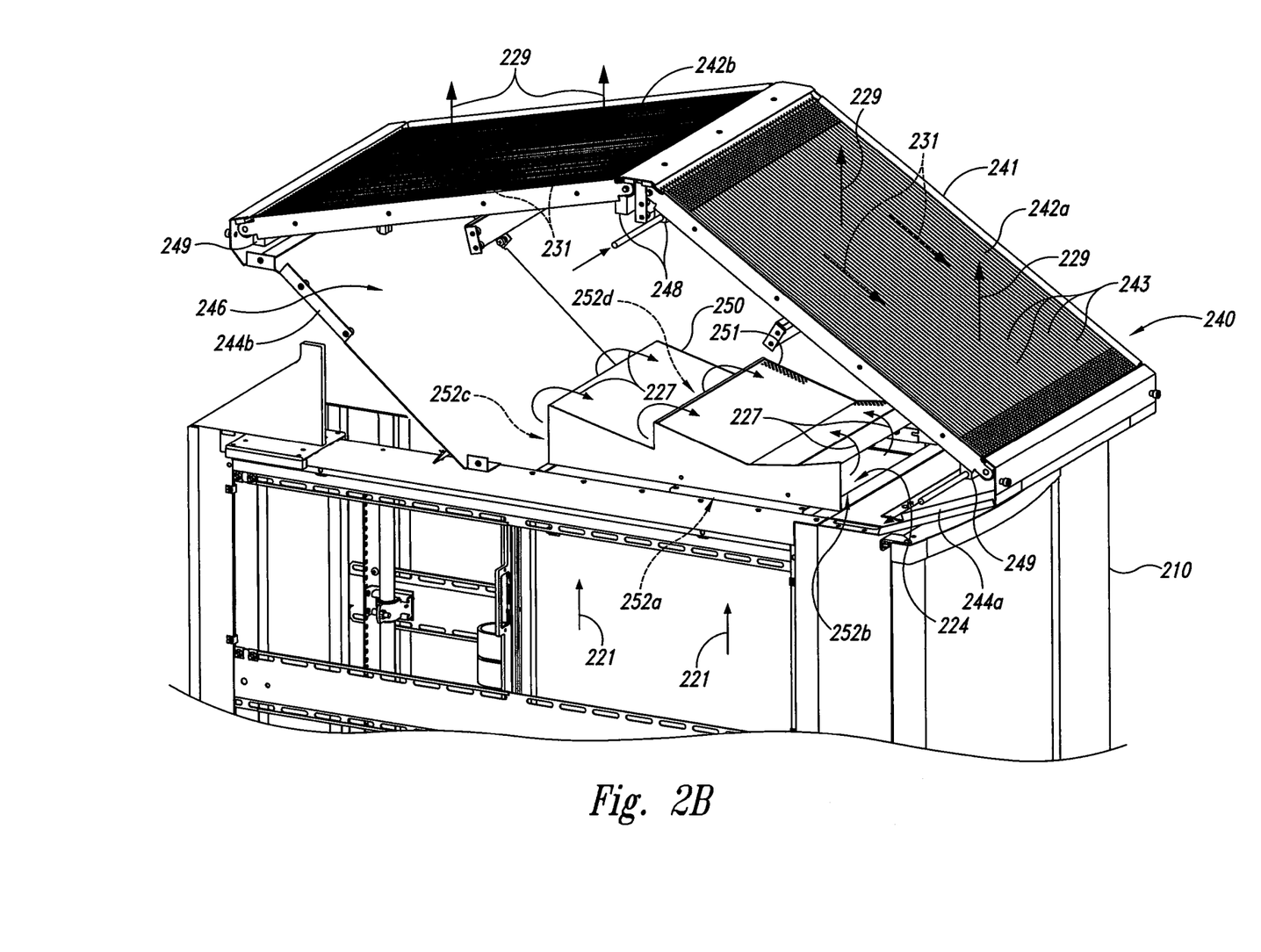
FIG. 2B is a partially enlarged isometric view of the overhead heat exchanger coupled to the computer cabinet of FIG. 2A.

FIG. 2A is a partially exploded isometric view of a computer system 200 having a computer cabinet 210 carrying an airflow restrictor 206 and an overhead heat exchanger 240 configured in accordance with an embodiment of the invention. FIG. 2B is a partially enlarged isometric view of the overhead heat exchanger 240 shown coupled to the computer cabinet 210. In the embodiment illustrated in FIG. 2A, some external panels of the computer cabinet 210 and the overhead heat exchanger 240 have been removed for clarity. In other embodiments, the computer cabinet 210 can include external panels and/or other intake components that are at least generally similar in structure and function to the corresponding structures described in detail in U.S. patent application Ser. No. 12/253,692 filed concurrently herewith and entitled "AIRFLOW INTAKE SYSTEMS AND ASSOCIATED METHODS FOR USE WITH COMPUTER CABINETS," which is incorporated herein in its entirety by reference.

Many features of the computer cabinet 210 can be at least generally similar in structure and function to corresponding features of the computer cabinet 110 described above with reference to FIG. 1. For example, the computer cabinet 210 can be positioned in a room 201 and can include a plurality of computer module compartments 218 (identified individually as first, second, and third module compartments 218a-c, respectively). A front air inlet 214 and a back air inlet 215 are positioned toward a bottom portion of the computer cabinet 210, and an air outlet 224 is positioned toward a top portion of the computer cabinet 210. A plurality of inter-compartmental gaps 217 (identified individually as a first gap 217a and a second gap 217b) separate the module compartments 218. The module compartments 218 individually hold a plurality of computer modules 212 in vertical, edgewise orientations. Each computer module 212 can include a motherboard carrying a plurality of processors, memory modules, routers, and other microelectronic devices individually covered with a corresponding shroud (not shown) to form separate airflow passageways extending vertically through the computer cabinet 210. In other embodiments, the computer cabinet 210 can carry switches, modems, and/or other types of computer modules and electronic devices in other configurations.

The computer cabinet 210 can also include an air mover assembly 202 positioned toward the bottom portion of the computer cabinet 210 to drive cooling air through the computer cabinet 210. The air mover assembly 202 can include an air mover 220 attached to a mounting plate 230 that includes an outlet opening 204 positioned proximate to the air mover 220. In one embodiment, the air mover 220 can include a vane-axial blower. In other embodiments, the air mover 220 can include a centrifugal fan, an axial fan, and/or other types of suitable air moving devices known in the art. In further embodiments, the air mover assembly 202 may be positioned toward the top portion of the computer cabinet 210.

Figure 6:
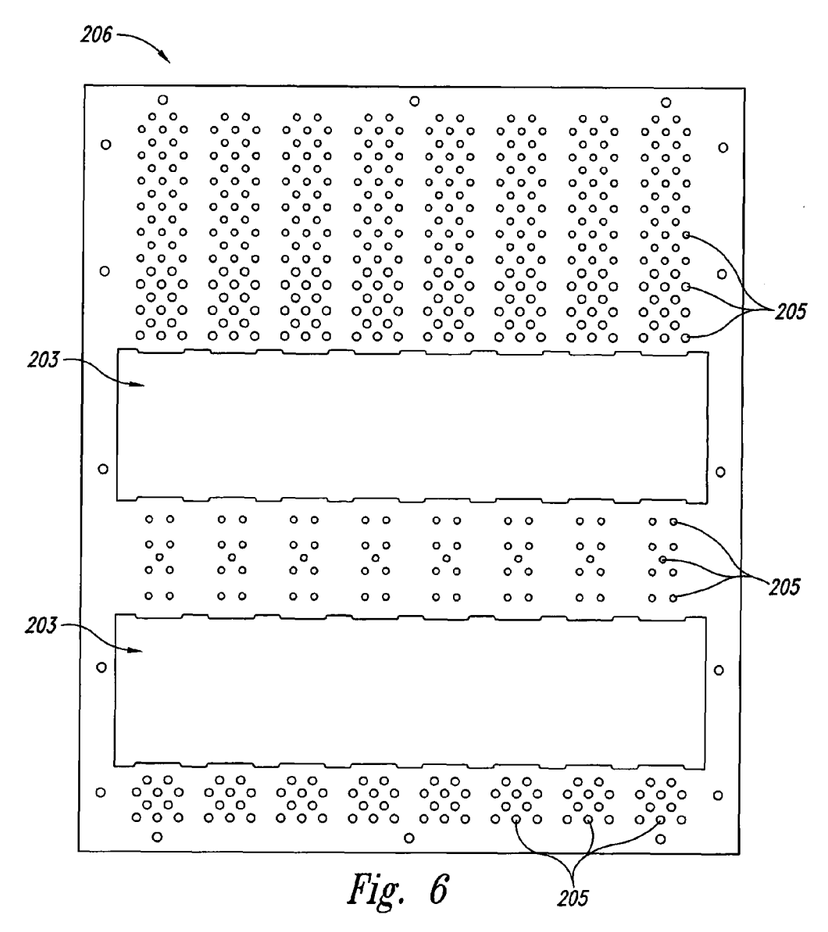
FIG. 6 is a plan view of the airflow restrictor of FIG. 2A configured in accordance with an embodiment of the invention.

The airflow restrictor 206 can be positioned proximate to the air outlet 224 on the computer cabinet 210. The airflow restrictor 206 can include a panel or planar member (e.g., a plate, a sheet, and/or other suitable panel or cover member) having one or more open portions 203 (two are shown for purposes of illustration) proximate to a plurality of restricted portions 205. An enlarged plan view of the airflow restrictor 206 is illustrated in FIG. 6. Referring to FIG. 2A and FIG. 6 together, the restricted portions 205 include a plurality of throughholes or apertures arranged in arrays in the substrate. In other embodiments, the restricted portions 205 can also include channels, slots, and/or other suitable flow modifying apertures or features. In further embodiments, the airflow restrictor 206 can also include vanes, grills, baffle plates, and/or other suitable structures in the open portions 203 for modifying a flow pattern of cooling air.

As described in greater detail below, the open portions 203 can be aligned, or at least generally aligned with airflow passageways through the computer cabinet 210 in which processors and/or other high-power microelectronic devices are located. Conversely, the restricted portions 205 can be aligned, or at least generally aligned with other passageways in which memory modules, network interface modules, and/or other low-power microelectronic devices are located. As used hereinafter, the phrases "high-power" and "low-power" are generally relative terms. For example, a memory module may be considered a high-power device because its power consumption is higher than, e.g., a network interface module, but may also be considered a low-power device because its power consumption is lower than, e.g., a processor. As a result, the memory module may be a high-power microelectronic device in one arrangement, but a low-power microelectronic device in a different arrangement.

Optionally, the computer cabinet 210 can include an inlet heat exchanger 222 positioned between the air mover assembly 202 and the first module compartment 218a. The inlet heat exchanger 222 can be configured to receive a coolant (e.g., a refrigerant, water, etc.) from an external source (not shown) that absorbs heat from the incoming cooling air. As a result, the cooling air can enter the first module compartment 218a at a desired temperature. One suitable inlet heat exchanger 222 is disclosed in U.S. patent application Ser. No. 10/805,875, the disclosure of which is incorporated herein by reference in its entirety. In other embodiments, the inlet heat exchanger 222 can include a plate-and-frame heat exchanger, a tube-and-shell heat exchanger, and/or other suitable types of heat exchanger. In certain embodiments, the inlet heat exchanger 222 can operate continuously. In other embodiments, the inlet heat exchanger 222 can operate intermittently; for example, when a temperature in the room 201 exceeds a threshold temperature (e.g., 80° C.). In further embodiments, the inlet heat exchanger 222 may be omitted.

The computer cabinet 210 can also optionally include one or more sensors (not shown) for monitoring operating conditions of the computer modules 212. For example, the computer cabinet 210 can include one or more temperature sensors (e.g., thermocouples, resistive temperature detectors, infrared temperature monitors, etc.), flow sensors (e.g., flow switches and flow transmitters), pressure sensors (e.g., pressure switches, pressure transmitters, etc.), and/or other types of sensors capable of measuring parameters indicative of operating conditions of the computer modules 212. For instance, the computer cabinet 210 can include thermocouples (not shown) positioned in each module compartment 218 to monitor operating temperatures inside the computer cabinet 210. In another embodiment, the computer cabinet 210 can include a flow transmitter (not shown) positioned toward the top portion of the computer cabinet 210 to measure the flow rate of cooling air through the top portion.

FIG. 2B is a partially enlarged isometric view of the overhead heat exchanger 240 coupled to the computer cabinet 210 of FIG. 2A. In the illustrated embodiment, the computer modules in the computer cabinet 210 and the side panels of the overhead heat exchanger 240 have been removed for clarity. In addition to the components shown in FIG. 2B, the overhead heat exchanger 240 can also include tubing, pipes, fittings, valves, regulators, and/or other mechanical and/or electrical components, which are not shown in FIG. 2B for clarity.

As shown in FIG. 2B, the overhead heat exchanger 240 can include a first support panel 244a and a second support panel 244b that couple a frame 241 to the air outlet 224 of the computer cabinet 210. The frame 241 carries a first heat exchanging portion 242a canted relative to a second heat exchanging portion 242b. The first and second heat exchanging portions 242a and 242b and the first and second support panels 244a and 244b along with side panels (not shown) form an enclosed space 246 on top of the computer cabinet 210.

Each of the first and second heat exchanging portions 242a and 242b can include a plurality of heat exchanging elements 243 arranged in a generally parallel fashion between an inlet header 248 and an outlet header 249. The inlet header 248 can be configured to receive a circulating coolant (e.g., a refrigerant, water, etc., (not shown)) from an external heat removal system (e.g., a cooling tower, not shown). The outlet header 249 can be configured to return the coolant to the external heat removal system after the coolant flows through the heat exchanging elements 243. Embodiments of the first and second heat exchanging portions 242a and 242b and the heat exchanging elements 243 having fins and passage portions are described in more detail below with reference to FIG. 4.

The overhead heat exchanger 240 can optionally include a flow element 250 for redistributing cooling air in the overhead heat exchanger 240. For example, in the illustrated embodiment, the flow element 250 includes a diffuser 251 having an inlet 252a positioned to receive air from the air outlet 224 of the computer cabinet 210, and outlets 252b, 252c that open into the enclosed space 246. The inlet 252a and the outlets 252b, 252c are generally perpendicular to each other. In other embodiments, the overhead heat exchanger 240 can also include baffle plates, static mixers, orifice plates, and/or other suitable device and structures for distributing air into the enclosed space 246.

Referring to FIGS. 2A and 2B together, in operation, the air mover assembly 202 draws cooling air (represented by arrows 219) into the computer cabinet 210 via the front air inlet 214 and the back air inlet 215. The air mover 220 drives the cooling air (represented by arrows 221) upward through the plate opening 204. The cooling air then flows past the computer modules 212 in the module compartments 218 and absorbs heat generated by the computer modules 212 during operation. The heated cooling air (represented by arrows 227) then flows through the airflow restrictor 206 and the optional outlet duct 250 and into the enclosed space 246 of the overhead heat exchanger 240.

As explained above, the airflow restrictor 206 can modify the flow pattern of cooling air flowing through individual passageways in the computer cabinet 210. As a result, the cooling air can efficiently absorb the heat from the computer modules 212 without causing the computer modules 212 in the upper module compartments (e.g., the second and third module compartments 218b and 218c) to overheat, as described in more detail below with reference to FIG. 3. Accordingly, several embodiments of the airflow restrictor 206 can facilitate attaining a high caloric rise per unit volume of the cooling air, as explained in more detail below. The high caloric rise is believed to improve the heat transfer efficiency of the overhead heat exchanger 240.

The overhead heat exchanger 240 with the enclosed space 246 and the optional flow element 250 can at least partially homogenize velocities and/or temperatures of the cooling air streams exiting the computer cabinet 210 through the airflow restrictor 206. For example, the flow element 250 can change a flow direction of the cooling air streams into the enclosed space 246. The enclosed space 246 can include a sufficiently large cross sectional area such that the combination of the enclosed space 246 and the optional flow element 250 can reduce the velocities of the air streams (e.g., high-power air streams) leaving the airflow restrictor 206. The enclosed space 246 can also provide a sufficiently large residence time such that the combination of the enclosed space 246 and the optional flow element 250 can promote adequate mixing of the air streams with one another in the overhead heat exchanger 240 to reach a generally uniform temperature. As a result, the cooling air streams can have a generally uniform temperature and/or velocity profile when approaching the heat exchanging elements 243.

The overhead heat exchanger 240 can then remove the heat from the cooling air before discharging the cooling air into the room 201. In the illustrated embodiment, the overhead heat exchanger 240 receives a coolant (e.g., a refrigerant, water, etc.) from an external coolant source (not shown) via the inlet header 248. The inlet header 248 distributes the coolant to the heat exchanging elements 243. The coolant (represented by arrows 231) flows across the heat exchanging elements 243 to the outlet header 249. As the coolant flows through the heat exchanging elements 243, cooling air (represented by arrows 229) flows past the heat exchanging elements 243, and the coolant absorbs heat from the cooling air. In one embodiment, the coolant is a partially vaporized, two-phase refrigerant (e.g., R134a). In other embodiments, the coolant includes a single-phase liquid or gas when flowing across the heat exchanging elements 243. The outlet header 249 then collects and discharges the coolant to the external coolant source and the cycle repeats.

Several embodiments of the computer cabinet 210 can efficiently remove heat from the computer modules 212 without using a refrigerated coolant, or with a reduced requirement for a refrigerated coolant. The term "refrigerated coolant" as used herein generally refers to a coolant at a temperature lower than that achievable using an atmospheric cooling tower. Without being bound by theory, it is believed that as the cooling air flows through the module compartments 218, the temperature of the cooling air increases, and thus the heat capacitance of the cooling air decreases. As a result, the temperature of the third module compartment 218c can be higher than that of the first and second module compartments 218a-b. This temperature gradient requires either an increased amount of cooling air flow or lower cooling air temperatures to adequately cool the computer modules 212 in the third module component 218c. One system utilizes intercoolers placed between adjacent module compartments 218 to reduce the temperature of the cooling air entering the second and third module compartments 218b and 218c. However, such intercoolers may not efficiently remove heat from the cooling air without a refrigerated coolant because the heat flux in the cooling air may be small after flowing through one of the module compartments 218. As a result, a refrigeration unit is typically needed to provide the refrigerated coolant in order to provide a sufficiently large temperature differential between the coolant and the cooling air for adequately removing heat from the cooling air. The refrigeration unit, however, consumes a considerable amount of energy in operation, and thus may be environmentally unfriendly. Another drawback of utilizing intercoolers is that the cooling air may bypass certain portions of the intercoolers and adversely affect computer modules 212 in a subsequent module compartment 218.

In one embodiment, the combination of the overhead heat exchanger 240 and the airflow restrictor 206 can sufficiently cool computer modules 212 in the computer cabinet 210 without utilizing intercoolers. As a result, the cooling air carries a greater heat flux and an increased caloric rise per unit volume of cooling air than a conventional system when the cooling air enters the overhead heat exchanger 240. The greater heat flux in the cooling air allows the coolant flowing through the overhead heat exchanger 240 to have a higher inlet temperature at the inlet header 248 than in a conventional system while still providing a sufficient temperature differential between the coolant and the cooling air. As a result, a refrigeration unit may not be needed to cool the coolant flowing in the inlet header, or may only be intermittently needed for this purpose. Accordingly, several embodiments of the computer system 200 can operate in an environmentally friendly fashion by reducing its power consumption.

Figure 4:
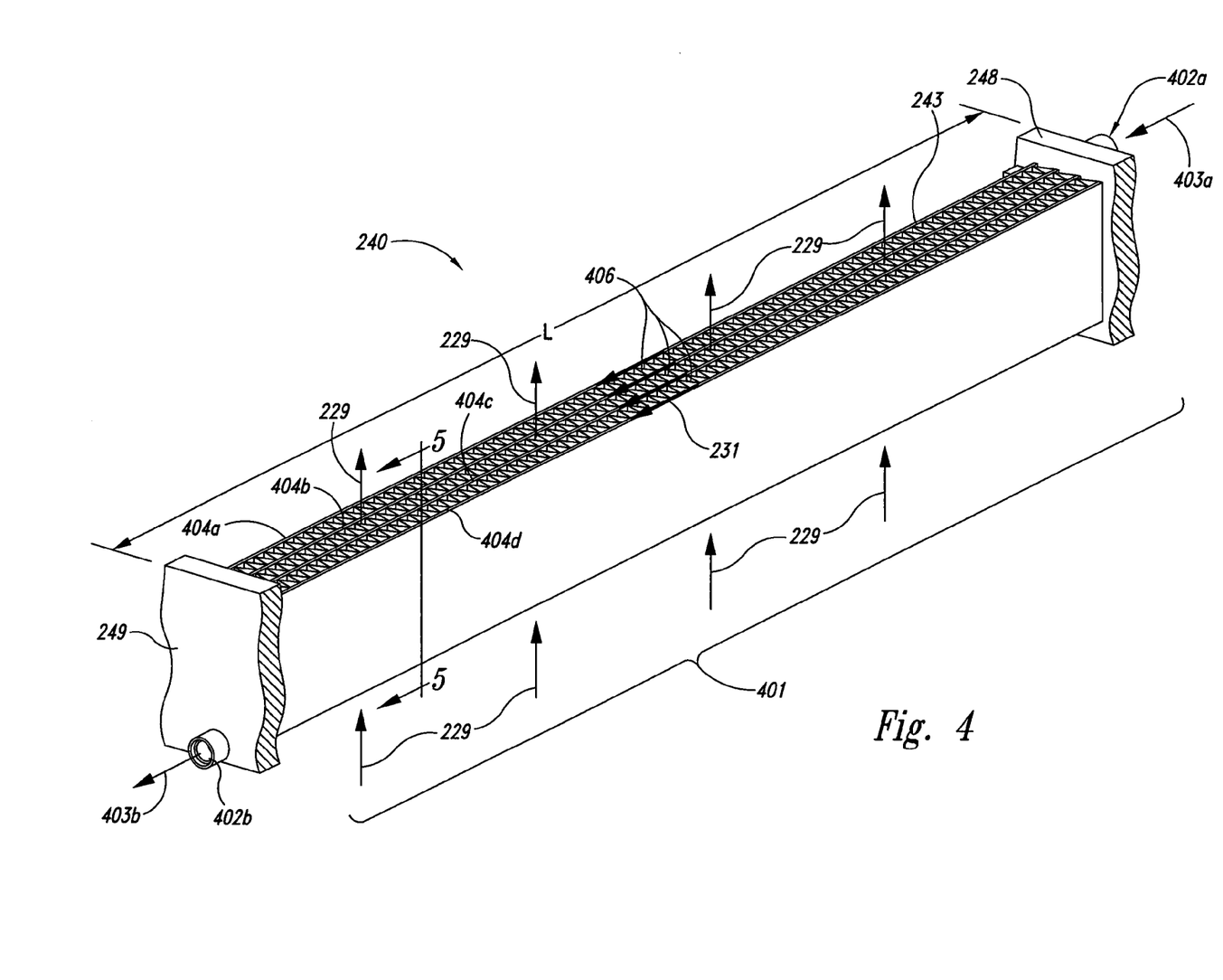
FIG. 4 is an enlarged isometric view of a portion of the overhead heat exchanger of FIGS. 2A and 2B configured in accordance with an embodiment of the invention.

In other embodiments, the overhead heat exchanger 240 can also improve the heat transfer efficiency between the heated air from the computer cabinet 210 and the coolant flowing through the heat exchanging elements 243, such that the computer cabinet 210 can be at least approximately "room neutral." The term "room neutral" generally refers to drawing the cooling air from the room 201 and discharging the air to the room 201 at the same, or approximately the same, temperature. Without being bound by theory, it is believed that high velocities of the heated air flowing through the overhead heat exchanger 240 may result in temperature gradients between and/or within certain components (e.g., fins and/or passage portions) of the heat exchanging elements 243. For example, it is believed that a temperature gradient may exist between the fins 406 (FIG. 4) and the adjacent passage portions 404 (FIG. 4). It is also believed that a temperature gradient may exist along the individual fins 406 between a first portion proximate to the passage portions 404 and a second portion spaced apart from the passage portions 404. As a result, only the boundary layers of the heated air can efficiently exchange heat with the coolant flowing through the overhead heat exchanger 240 while the bulk of the heated air pass through with insufficient heat transfer to the coolant. Accordingly, by reducing the velocities of the heated air streams, the heat flux flowing between the heated air and coolant can be decreased, and the temperature gradients can be at least reduced. As a result, the temperature of the air exiting the overhead heat exchanger 240 can be at least close to the temperature of the coolant (e.g., within 1.5° C.) and/or the temperature of the room.

Even though the airflow restrictor 206 is used in the computer cabinet 210 for modifying the flow profile of the cooling air, in other embodiments, the computer cabinet 210 can also include other types of components for increasing the flow rates in the high-power passageways. For example, the computer cabinet 210 can also include louvers, dampers, valves, and/or other flow elements between individual module compartments 218 for modulating flow rates in the computer cabinet 210, or the restrictor 206 can be omitted.

Figure 3:
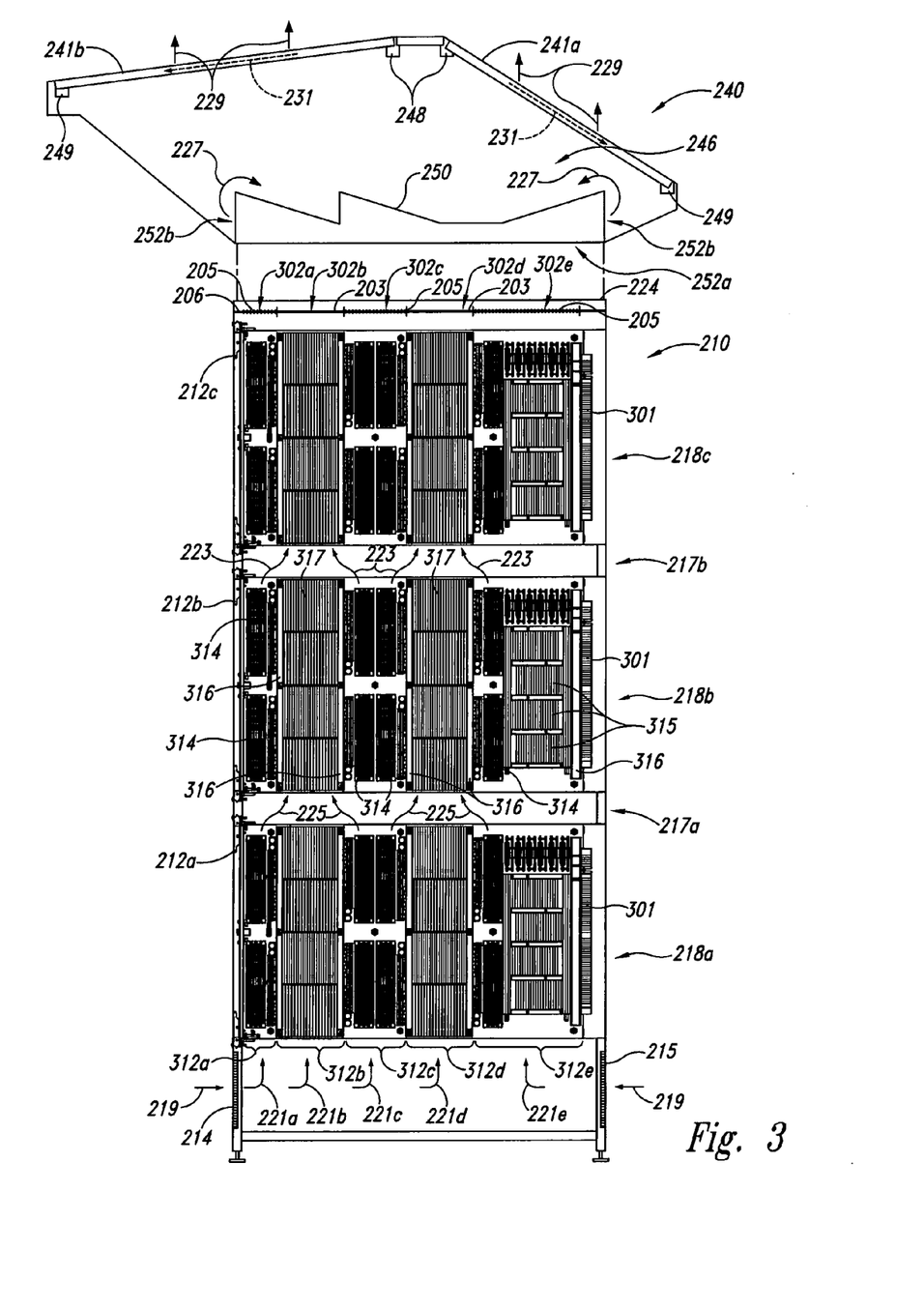
FIG. 3 is a partial, side-elevation view of the computer cabinet and the overhead heat exchanger of FIGS. 2A and 2B.

FIG. 3 is a side elevation view of the computer cabinet 210 with the airflow restrictor 206 and the overhead heat exchanger 240 of FIGS. 2A and 2B. The air mover assembly 202 (FIG. 2A) has been removed from FIG. 3 for purposes of clarity. As shown in FIG. 3, the first, second, and third module compartments 218a-c can include first, second, and third computer modules 212a-c, respectively. While the computer modules 212a-c are shown in FIG. 3 as having generally similar configurations to one another, in other embodiments, at least one of the computer modules 212a-c can have a different configuration than the others.

The individual computer modules 212a-c can include a motherboard 301 with a plurality of dividers 316 that separate the computer modules 212a-c into discrete regions 312 (identified individually as first to fifth regions 312a-e, respectively). Each region 312 can hold various types of microelectronic devices. For example, in the illustrated embodiment, the motherboard 301 carries memory modules 314, network interface modules 315, and/or other suitable low-power microelectronic devices in the first, third, and fifth regions 312a, 312c, and 312e, respectively (hereinafter referred to as the "low-power regions"). The motherboard 301 also carries processors with cooling fins 317 and/or other high-power microelectronic devices in the second and fourth regions 312b and 312d, respectively (hereinafter referred to as the "high-power regions"). In other embodiments, the motherboard 301 can have the dividers 316 in other arrangements and/or can carry different microelectronic devices in at least one of the regions 312a-e.

The individual computer modules 212a-c can also include a plurality of shrouds (not shown) corresponding to one or more of the individual regions 312a-e. The shrouds and the dividers 316 together form airflow passageways 302 (identified individually as first to fifth passageways 302a-e, respectively) generally corresponding to each of the regions 312. For example, the first, third, and fifth passageways 302a, 302c, and 302d (hereinafter referred to as "low-power passageways") generally correspond to the low-power regions. The second and fourth passageways 302b and 302d (hereinafter referred to as "high-power passageways") generally correspond to the high-power regions. In the illustrated embodiment, the passageways 302 of the computer modules 212a-c are generally aligned vertically in the computer cabinet 210. In other embodiments, the passageways 302 of individual computer modules 212a-c may be offset from one another or may be aligned in other directions.

In the illustrated embodiment, the airflow restrictor 206 is positioned adjacent to the third computer module 212c and the outlet 224. In this embodiment, the open portions 203 are generally aligned with the high-power passageways, and the restricted portions 205 are generally aligned with the low-power passageways. In other embodiments, other correspondence can be used, e.g., in certain embodiments, at least one of the open portions 203 can be generally aligned with at least one of the low-power passageways.

In operation, the air mover assembly 202 (FIG. 2A) draws cooling air (represented by arrows 219) into the computer cabinet 210 and drives the cooling air upward toward the computer modules 212a-c. The cooling air flows through the computer modules 212a-c in a plurality of cooling air streams 221 (identified individually as first to fifth air streams 221a-e, respectively) via the passageways 302. In the illustrated embodiment, the cooling air streams 221 flow through the first and second module compartments 218a-b and past the first and second computer modules 212a-b without restriction. As a result, the air streams 221 flow through each of the passageways 302 along paths of least resistance. For example, absent the flow restrictor 206, the low-power passageways would typically have a lower flow resistance than the high-power passageways. As a result, the first, third, and fifth cooling air streams 221a, 221c, and 221e, respectively (hereinafter referred to as the "low-power air streams") flowing through the low-power passageways have higher flow rates than the second and fourth cooling air streams 221b and 221d, respectively (hereinafter referred to as the "high-power air streams") flowing through the high-power passageways.

As the cooling air flows through the third module compartment 218c, the airflow restrictor 206 can restrict the low-power air streams more than the high-power air streams. For example, as shown in FIG. 3, the open portions 203 of the airflow restrictor 206 allow the high-power air streams to directly exit the outlet 224 into the overhead heat exchanger 240, while the restricted portions 205 disrupt the flow of the low-power air streams exiting the computer cabinet 210. The disruption increases the flow resistance to the low-power air streams than the high-power air streams. In one embodiment, the restricted portions 205 create a pressure drop for at least one of the low-power air streams across the airflow restrictor 206. In other embodiments, the restricted portions 205 can otherwise limit the volume and/or modify other flow characteristics of the low-power air streams to increase the flow through the high-power streams.

Without being bound by theory, it is believed that the airflow restrictor 206 can thus increase the mass flow rates and velocities of the high-power air streams with increasing velocities and mass flow rates generally corresponding to (e.g., proportional to) the increase in air temperature past the computer modules 212, while decreasing the flow rates of the adjacent low-power air streams. For example, as the low-power air streams leave the second module compartment 218b, the restricted portions 205 increase the pressure drop in the low-power air streams through the airflow restrictor 206 and force a portion of the cooling air to flow laterally (as indicated by arrows 223) through the second gap 217b into the high-power passageways. As a result, the high-power air streams have higher mass flow rates entering the third module compartment 218c and higher velocities flowing past the third computer module 212c than those entering the second module compartment 218b. The higher mass flow rates and velocities are believed to improve heat transfer efficiency between the computer modules 212 to the cooling air.

In several embodiments of the computer system 200, by restricting a portion of the cooling air exiting the computer cabinet 210 and allowing cross-mixing of cooling air between adjacent module compartments 218 as disclosed herein, the amount of cooling air supplied to the high-power passageways of the third computer module 212c can be increased without significantly increasing the pressure, drop across the computer cabinet 210. Furthermore, the airflow restrictor 206 can also drive a portion of the cooling air to flow laterally (as indicated by arrows 225) through the first gap 217a into the high-power passageways of the second computer module 212b. As a result, the high-power air streams flowing into the third module compartment 218c can have increased mass flow rates and velocity as the cooling air flows from one module compartment 218 to the next. As a result, the high-power air streams can sufficiently cool the third computer module 212c without requiring inter-cooling between the module compartments 218.

Even though the computer cabinet 210 is shown in FIG. 3 as having one airflow restrictor 206 positioned proximate to the outlet 224, in other embodiments, the computer cabinet 210 can also include airflow modifying devices (e.g., generally similar to or different from the airflow restrictor 206) between adjacent module compartments 218 and/or between the first module compartment 218a and the air mover assembly 202 (FIG. 2). Accordingly, the present invention is not limited to the particular embodiment illustrated in FIG. 3, but extends to other airflow modifying configurations as described herein.

FIG. 4 is an isometric view of a portion of the heat exchanging elements 243 of the overhead heat exchanger 240 of FIGS. 2A and 2B configured in accordance with an embodiment of the invention. As shown in FIG. 4, the heat exchanging elements 243 can include a plurality of spaced-apart conduits or passage portions 404 (identified individually as passage portions 404a-d) extending between the inlet header 248 and the outlet header 249. The inlet header 248 includes an inlet port 402a configured to receive a coolant (e.g., a refrigerant, water, etc., represented by arrow 403a) from an external coolant source (not shown). The outlet header 249 includes an outlet port 402b configured to discharge the coolant (represented by arrow 403b) from the passage portions 404 to the external coolant source. The inlet header 248 and the outlet header 249 can be constructed from copper, aluminum, stainless steel, or other suitable materials known in the art with sufficient mechanical strength.

The heat exchanging elements 243 can also include a plurality of fins 406 extending between adjacent passage portions 404. In one embodiment, the fins 406 can be convoluted or corrugated to form air flow passages for the cooling air to flow through. In other embodiments, the fins 406 can be eliminated, and the passage portions 404 can be separated by spacers. In a further embodiment, the space between the passage portions 404 can be entirely open. One embodiment of the passage portion 404 is described in more detail below with reference to FIG. 5.

In operation, the coolant (represented by arrow 403a) enters the overhead heat exchanger 240 through the inlet port 402a. The inlet header 248 distributes the coolant to the passage portions 404. The coolant (represented by arrow 231) flows across the passage portions 404 to the outlet header 249. As the coolant flows through the passage portions 404, cooling air (represented by arrow 229) flows through the fins 406 and past the passage portions 404. The coolant absorbs heat from the cooling air as the coolant flows across the passage portions 404. In one embodiment, the coolant is a partially vaporized, two-phase refrigerant. As a result, the coolant has an at least approximate constant temperature across the length L of the passage portions 404. In other embodiments, the coolant can have a single phase when flowing across the passage portions 404. The outlet header 249 then collects and discharges the coolant (represented by arrow 403b) from the outlet port 402b to the external coolant source.

Even though the heat exchanging elements 243 are shown to have one layer of passage portions 404, in other embodiments, the heat exchanging elements 243 can have two, three, or any desired number of layers of passage portions 404 between the inlet header 248 and the outlet header 249. In further embodiments, the heat exchanging elements 243 can have two, three, or any desired number of layers of passage portions 404 individually coupled to corresponding inlet and outlet headers (not shown). In further embodiments, other types of heat exchanges can be used. Accordingly, the present invention is not limited to the particular embodiments of heat exchangers disclosed herein, but includes other types of heat exchangers known in the art.

Figure 5:
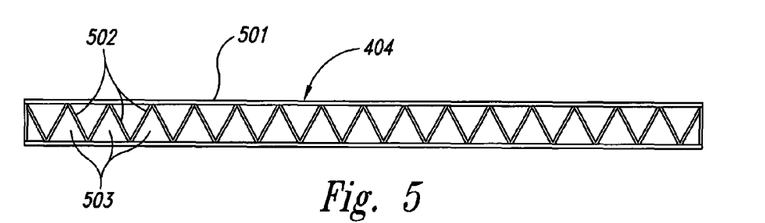
FIG. 5 is a cross-sectional view taken along lines 5-5 in FIG. 4, illustrating a passage assembly configured in accordance with an embodiment of the invention.

FIG. 5 is a cross-sectional view taken along lines 5-5 in FIG. 4 of an individual passage portion 404. As shown in FIG. 5, the passage portion 404 can include an outer shell 501 enclosing a plurality of internal dividers 502. The dividers 502 can be arranged in a corrugated fashion to form a plurality of channels 503 for fluid transfer. Although the illustrated embodiment shows corrugated dividers 502 in a saw-tooth arrangement, in other embodiments, the separator 502 can have straight vertical, straight horizontal, sinusoidal arrangements, and/or other suitable arrangements or omitted. The passage portion 404 can be constructed from copper, aluminum, stainless steel, or any other suitable material having sufficient mechanical strength and/or thermal conductivity. The passage portion 404 can be constructed using a variety of suitable manufacturing methods, such as brazing, welding, bonding, fastening, etc.

Figure 7:
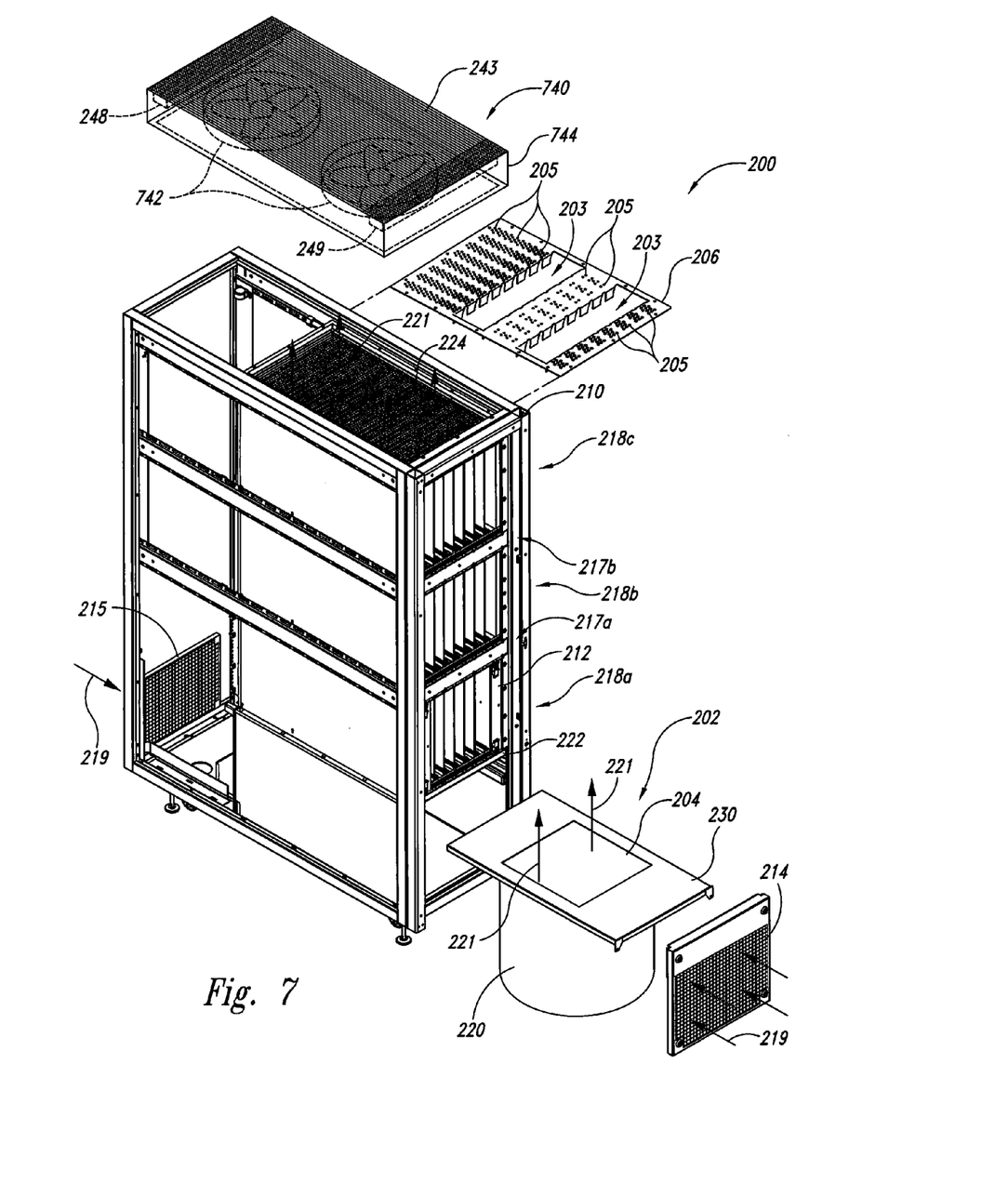
FIG. 7 is a partially exploded isometric view of a computer system having a computer cabinet carrying an airflow restrictor and a rectangular overhead heat exchanger configured in accordance with another embodiment of the invention.

FIG. 7 is a partially exploded isometric view of the computer cabinet 210 that carries the airflow restrictor 206 and a rectangular overhead heat exchanger 740 configured in accordance with another embodiment of the invention. As shown in FIG. 7, the overhead heat exchanger 740 can include a generally rectangular frame 744 that carries a plurality of heat exchanging elements 243 arranged generally parallel to the air outlet 224 of the computer cabinet 210. The overhead heat exchanger 740 can also include a plurality of optional fans 742 for mixing the cooling air in the overhead heat exchanger 740.

Figure 8:
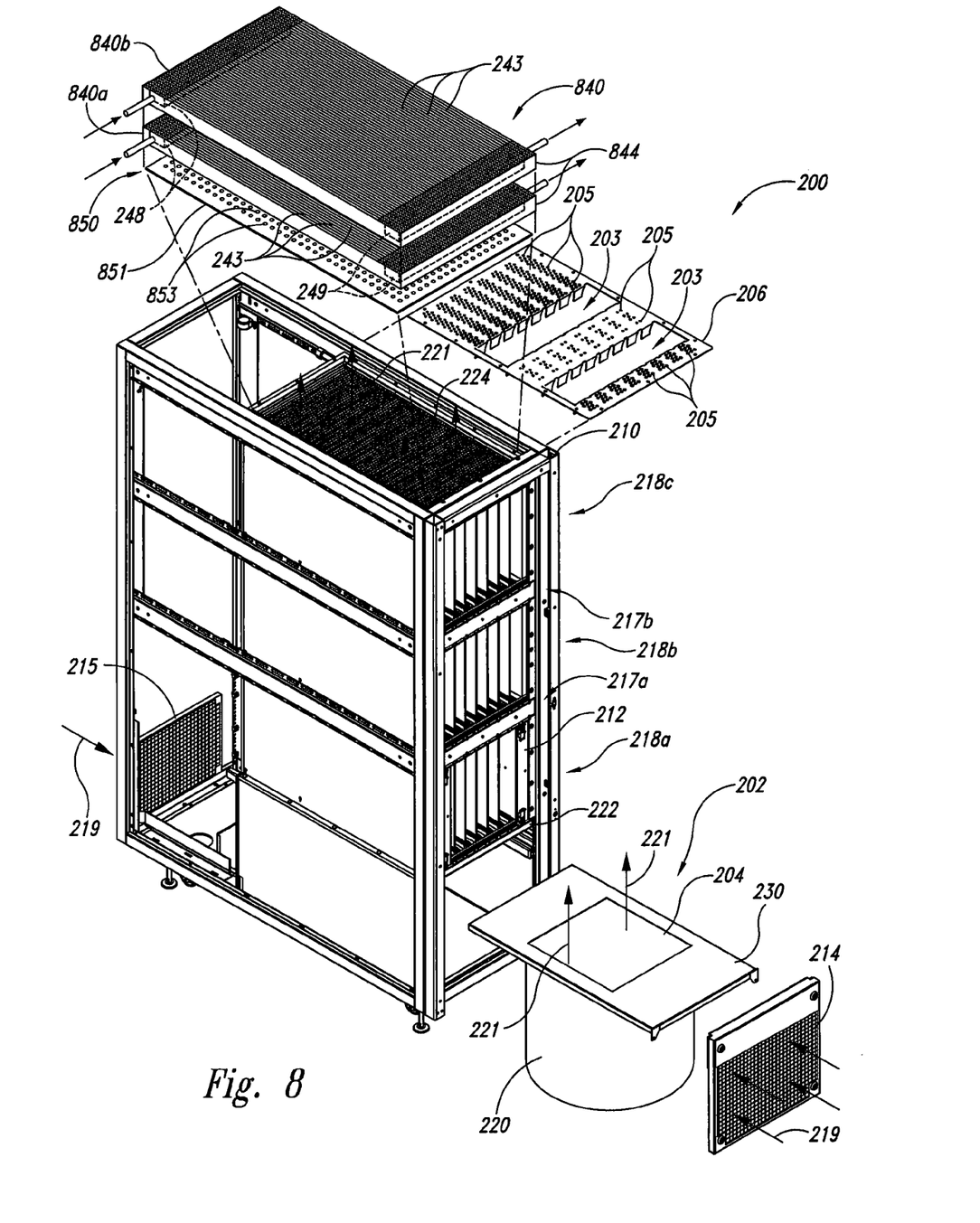
FIG. 8 is a partially exploded isometric view of a computer system having a computer cabinet carrying an airflow restrictor and a stacked overhead heat exchanger configured in accordance with another embodiment of the invention.

FIG. 8 is a partially exploded isometric view of the computer cabinet 210 that carries the airflow restrictor 206 and a stacked overhead heat exchanger 840 configured in accordance with another embodiment of the invention. As shown in FIG. 8, the overhead heat exchanger 840 can include a first heat exchanging assembly 840a and a second heat exchanging assembly 840b mounted on the computer cabinet 210 in series. The individual first and second heat exchanging assemblies 840a and 840b can include a generally rectangular frame 844 that carries a plurality of heat exchanging elements 243 arranged generally parallel to the air outlet 224 of the computer cabinet 210. In certain embodiments, the second heat exchanging assembly 840b can be directly on top of the first heat exchanging assembly 840a. In other embodiments, the overhead heat exchanger 840 can also include a plenum between the first and second heat exchanging assemblies 840a and 840b.

In certain embodiments, the first and second heat exchanging assemblies 840a and 840 can be coupled to the same external coolant supply (not shown). In other embodiments, the first heat exchanging assembly 840a can be coupled to a first external coolant supply (not shown), and the second heat exchanging assembly 840b can be coupled to a second external coolant supply (not shown) different from the first external coolant supply. In operation, if one of the first and second external coolant supplies fails, the other can still supply a coolant to one of the first and second heat exchanging assemblies 840a and 840 for removing heat from the cooling air exiting the air outlet 224 of the computer cabinet 210. As a result, the computer modules 212 in the computer cabinet 210 can continue to operate, and thus the impact of the operational upset can be at least ameliorated.

In the illustrated embodiment, the overhead heat exchanger 840 includes a diffuser 850 between the first heat exchanging assembly 840a and the air outlet 224 of the computer cabinet 210. The diffuser 850 includes a panel or planar member (e.g., a plate, a sheet, and/or other suitable panel or cover member) having a plurality of apertures 853. In other embodiments, the diffuser 850 can include slots, channels, other types of perforations, and/or other components suitable for modifying a flow pattern of the cooling air exiting the computer cabinet 210 through the airflow restrictor 206. In further embodiments, the overhead heat exchanger 840 can also include another diffuser (e.g., generally similar to or structurally different from the diffuser 850, not shown) between the first and second heat exchanging assemblies 840a and 840b. In yet further embodiments, the diffuser 850 can be omitted.

Even though the overhead heat exchanger 840 is shown in FIG. 8 as having two heat exchanging assemblies 840a and 840b, in other embodiments, the overhead heat exchanger 840 can include three, four, or any other desired number of heat exchanging assemblies. In further embodiments, the first and second heat exchanging assemblies 840a and 840b can have different configurations. For example, first and second heat exchanging assemblies 840a and 840b can have different material of construction, fin configuration, number of heat exchanging elements, and/or other characteristics. In yet further embodiments, the first and second heat exchanging assemblies 840a and 840b can be positioned at different locations and coupled to each other with a piece of pipe, conduit, and/or other flow components.

From the foregoing, it will be appreciated that specific embodiments of the invention have been described herein for purposes of illustration, but that various modifications may be made without deviating from the spirit and scope of the invention. For example, although elements of the invention described above have been presented in one or more arrangements, in other embodiments, other arrangements are possible depending on the particular situation. Further, while advantages associated with certain embodiments of the invention have been described in the context of those embodiments, other embodiments may also exhibit such advantages, and not all embodiments need necessarily exhibit such advantages to fall within the scope of the invention. Accordingly, the invention is not limited, except as by the appended claims.

We claim:

1. A computer system comprising:
a computer cabinet including an air inlet and an air outlet;
a plurality of low-power electrical components arranged in a first passageway in the computer cabinet;
a plurality of high-power electrical components arranged in a second passageway spaced apart from the first passageway in the computer cabinet;
at least one air mover configured to move a first flow of cooling air and a second flow of cooling air through the computer cabinet from the air inlet toward the air outlet, wherein the first flow of cooling air flows through the first passageway and past the plurality of low-power electrical components at a first flow rate, and wherein the second flow of cooling air flows through the second passageway and past the plurality of high-power electrical components at a second flow rate, greater than the first flow rate; and
a heat exchanger carried by the computer cabinet proximate the air outlet, wherein the heat exchanger is configured to remove heat from the first and second flows of cooling air exiting the computer cabinet through the air outlet by circulating coolant through a plurality of spaced apart fluid conduits.

2. The computer system of claim 1, further comprising an air flow restrictor carried by the computer cabinet and configured to restrict the first flow of cooling air flowing through the first passageway.

3. The computer system of claim 1, further comprising:
an air flow restrictor positioned downstream of the low-power electrical components; and
wherein the heat exchanger is positioned downstream of the air flow restrictor.

4. The computer system of claim 1, further comprising:
an air flow restrictor positioned downstream of the low-power electrical components;
a diffuser positioned downstream of the air flow restrictor, wherein the diffuser is configured to redistribute air flowing into the heat exchanger from the first and second air flows.

5. The computer system of claim 1 wherein the heat exchanger includes a first heat exchanging portion and a second heat exchanging portion canted relative to the first heat exchanging portion, the first heat exchanging portion having a first portion of the fluid conduits spaced apart by a first plurality of fins, and the second heat exchanging portion having a second portion of the fluid conduits spaced apart by a second plurality of fins.

6. The computer system of claim 1 wherein the heat exchanger includes a first heat exchanging portion and a second heat exchanging portion mounted to the computer cabinet in series, wherein the first heat exchanging portion is coupled to a first external coolant supply and the second heat exchanging portion is coupled to a second external coolant supply, different from the first external coolant supply.

7. The computer system of claim 1, further comprising:
a first computer module compartment positioned in the computer cabinet;
a second computer module compartment positioned in the computer cabinet above the first computer module compartment;
a first plurality of computer modules positioned in the first computer module compartment, wherein the first plurality of computer modules carry a first portion of the low-power electrical components and a first portion of the high-power electrical components; and a second plurality of computer modules positioned in the second computer module compartment, wherein the second plurality of computer modules carry a second portion of the low-power electrical components and a second portion of the high-power electrical components.

8. The computer system of claim 1, further comprising:

a first computer module compartment positioned in the computer cabinet;

a second computer module compartment positioned in the computer cabinet above the first computer module compartment;

a first plurality of computer modules positioned in the first computer module compartment, wherein the first plurality of computer modules carry a first portion of the low-power electrical components and a first portion of the high-power electrical components; and a second plurality of computer modules positioned in the second computer module compartment, wherein the second plurality of computer modules carry a second portion of the low-power electrical components and a second portion of the high-power electrical components, wherein the air mover is positioned below the first computer module compartment and is configured to move the first and second flows of cooling air upwardly through the computer cabinet from the air inlet toward the air outlet, and wherein the heat exchanger is positioned on top of the computer cabinet proximate the air outlet.

9. The computer system of claim 1 wherein the overhead heat exchanger includes:

a frame carrying a first heat exchanging portion and a second heat exchanging portion;

at least first and second support panels configured to couple the overhead heat exchanger to the computer cabinet, the first and second heat exchanging portions and the first and second support panels at least partially defining an enclosure on top of the computer cabinet; and a flow element positioned at least partially within the enclosure, wherein the flow element and the enclosure cooperate to reduce a velocity of the first and second flows of cooling air exiting the computer cabinet through the air outlet.

10. The computer system of claim 1, further comprising:

an air flow restrictor carried by the computer cabinet and configured to restrict the first flow of cooling air flowing through the first passageway; and wherein the overhead heat exchanger includes:

a frame carrying a first heat exchanging portion and a second heat exchanging portion canted relative to the first heat exchanging portion;

first and second support panels configured to couple the overhead heat exchanger to the computer cabinet, the first and second heat exchanging portions and the first and second support panels being configured to at least partially define an enclosure, and a diffuser positioned above the air flow restrictor and at least partially within the enclosure, wherein the diffuser and the enclosure cooperate to reduce a velocity of the cooling air from the computer cabinet and to at least partially homogenize a temperature of the cooling air from the computer cabinet.

* * * * *

UNITED STATES PATENT AND TRADEMARK OFFICE
CERTIFICATE OF CORRECTION

PATENT NO. : 8,537,539 B2  
APPLICATION NO. : 13/211386  
DATED : September 17, 2013  
INVENTOR(S) : Wade J. Doll et al.

Page 1 of 1

It is certified that error appears in the above-identified patent and that said Letters Patent is hereby corrected as shown below:

In the Specification

In column 9, line 18, delete "pressure," and insert -- pressure --, therefor.

Signed and Sealed this
Twenty-fourth Day of December, 2013

Margaret A. Focarino
*Commissioner for Patents of the United States Patent and Trademark Office*